(12) United States Patent
Su et al.

(10) Patent No.: US 9,142,286 B2
(45) Date of Patent: Sep. 22, 2015

(54) INTEGRATED CIRCUIT MEMORY DEVICE WITH READ-DISTURB CONTROL

(71) Applicant: Applied Micro Circuits Corporation, Sunnyvale, CA (US)

(72) Inventors: Jason T Su, Los Altos, CA (US); Jitendra Khare, San Jose, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 134 days.

(21) Appl. No.: 13/863,208

(22) Filed: Apr. 15, 2013

(65) Prior Publication Data

US 2014/0307500 A1   Oct. 16, 2014

(51) Int. Cl.
| | |
|---|---|
| *G11C 8/00* | (2006.01) |
| *G11C 11/419* | (2006.01) |
| *G11C 7/02* | (2006.01) |
| *G11C 8/08* | (2006.01) |
| *G11C 11/418* | (2006.01) |

(52) U.S. Cl.
CPC .............. *G11C 11/419* (2013.01); *G11C 7/02* (2013.01); *G11C 8/08* (2013.01); *G11C 11/418* (2013.01)

(58) Field of Classification Search
CPC ........................................................ G11C 8/00
USPC .................................................... 365/230.06
See application file for complete search history.

(56) References Cited

U.S. PATENT DOCUMENTS

| | | | |
|---|---|---|---|
| 2008/0205184 A1* | 8/2008 | Tsukude | 365/226 |
| 2009/0009003 A1* | 1/2009 | Roth et al. | 307/75 |
| 2011/0007590 A1* | 1/2011 | Katayama | 365/203 |
| 2011/0188281 A1* | 8/2011 | Siau et al. | 365/51 |

\* cited by examiner

*Primary Examiner* — Min Huang

(57) ABSTRACT

A device (e.g., an integrated circuit memory device such as a static random access memory device) includes word line drivers. Each of the word line drivers includes a pull-up device that is coupled to a node via a shared line. A precharge device is coupled between a power supply and the node. The precharge device and a pull-up device for a selected word line driver are controlled to allow the power supply to charge the node and then to allow the charge stored in the node to flow into a word line corresponding to the selected word line driver.

20 Claims, 4 Drawing Sheets

INTEGRATED CIRCUIT MEMORY DEVICE WITH READ-DISTURB CONTROL

BACKGROUND

A static random access memory (SRAM) includes an array of individual bit cells. "Read-disturb" occurs when the SRAM is accessed for a read. Read-disturb can occur as a result of injecting charge into a bit cell's storage nodes from the bit cell's bit lines when the bit cell's word line is asserted. The injection of the charge generates noise at the storage nodes and destabilizes the bit cell. Read-disturb can have other causes such as RTS (random telegraph signals) and particle strikes. If the disturb noise exceeds the tolerance of the bit cell (the static noise margin (SNM)), then the value stored in the bit cell flips (e.g., changes from low to high, from binary logic zero to binary logic one, or vice versa), corrupting the data stored by the SRAM.

As memory technologies advance, the SNM of SRAM continues to decrease while the total number of bit cells in an integrated circuit (IC) design continues to increase. As a result, the probability of an SRAM failure related to read-disturb increases significantly. Thus, without an effective way to control or to reduce read-disturb in SRAMs, making an IC or a system-on-chip (SOC) product that includes SRAM may become impractical.

Various solutions have been proposed and implemented in an attempt to mitigate read-disturb. However, each of these solutions has its shortcomings. For example, they may utilize either multi-regulator or replica-access-transistor (RAT) schemes, which increase the complexity of the design, can make the design more sensitive to process, voltage, and temperature (PVT) variations, and can introduce a significant leakage current.

Another proposed solution uses a multiplexed supply voltage for the word line, to raise instead of lower the word line voltage. As a result, the complexity of the design is increased, performance is slowed, and reliability may be an issue due to the excessive stress put on the pass gate devices by the method of raising supply voltage.

Yet another proposed solution uses a delay mechanism. However, the delay circuitry slows performance and thus renders the scheme impractical for modern SRAM designs.

SUMMARY

In an embodiment according to the present invention, a device (e.g., an integrated circuit memory device such as an SRAM device) includes word line drivers, where each of the word line drivers includes a pull-up device that is coupled to a node via a shared line. A precharge device is coupled between a power supply and the node. The precharge device and a pull-up device for a selected word line driver are controlled to allow the power supply to charge the node and then to allow the charge stored in the node to flow into a word line corresponding to the selected word line driver.

In one such embodiment, in a precharge phase, the precharge device is turned on and the node is charged to a level corresponding to the voltage level of the power supply. In an evaluation phase following the precharge phase, the precharge device is turned off and the pull-up device for the selected word line driver is turned on, allowing the charge stored in the node to flow into the word line corresponding to the selected word line driver.

Advantageously, embodiments according to the present invention mitigate read-disturb and improve static noise margin without additional components such as regulators, multiplexers, resistor elements, etc., reducing the size and cost of the integrated circuit memory device.

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the embodiments of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
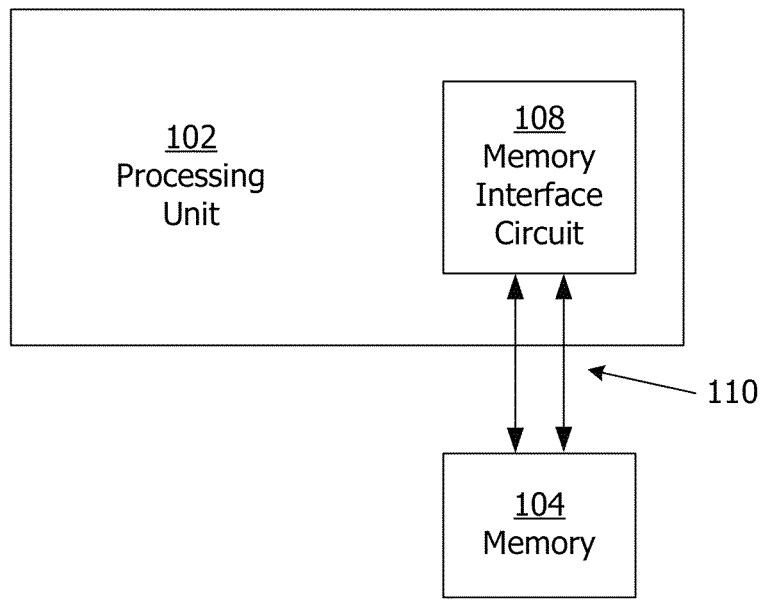
FIG. 1 is a block diagram of a system upon which embodiments according to the present invention can be implemented.

FIG. 1 is a block diagram of a system 100 upon which embodiments according to the present invention can be implemented. The system 100 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, the system 100 may be provided on a single board, on multiple boards, or within multiple enclosures.

In the example of FIG. 1, the system 100 includes a processing unit 102 and a memory unit 104 interconnected by one or more buses. According to this example, a memory interface circuit 108 (which may also be referred to as a memory controller) is embedded in the processing unit 102. The system 100 may include other components in addition to those illustrated and described.

The processing unit 102 of FIG. 1 may direct data to an appropriate system component for processing or storage, execute a program, or perform some other function. The processing unit 102 can be a central processing unit (CPU) or a microprocessor, for example. In one embodiment, the memory unit 104 is a static random access memory (SRAM) device. In such an embodiment, the SRAM may be used in the cache of the processing unit 102.

The memory interface circuit 108 can communicate information, addresses, commands, and/or data to and from the memory unit 104 via a set of data, command, and signal lines (collectively, lines 110). For example, a command line can communicate command bits to the memory unit 104, to cause that unit to perform operations such as read or write operations.

Figure 2:
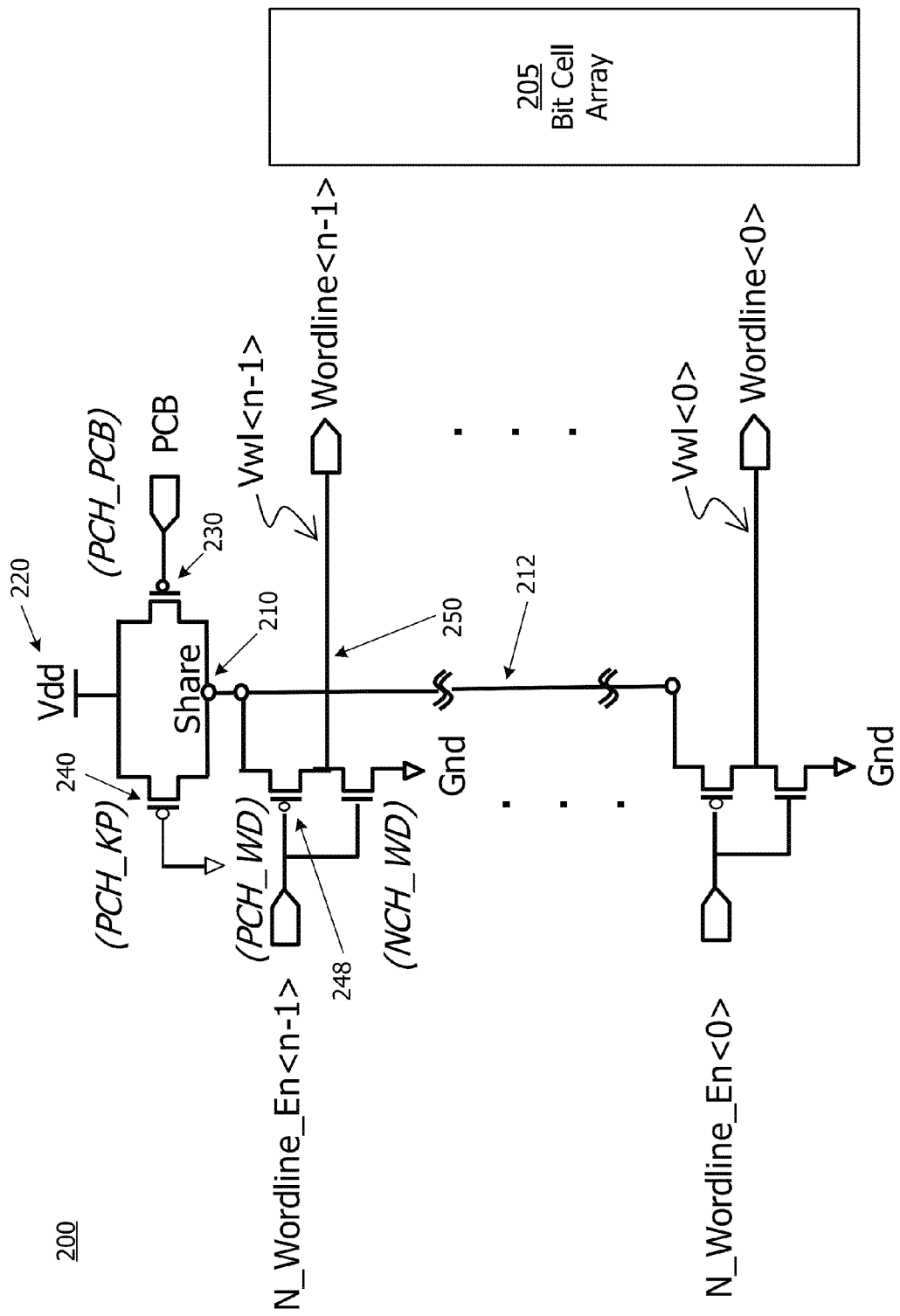
FIG. 2 illustrates a circuit for read-disturb control in an embodiment according to the present invention.

FIG. 2 illustrates an apparatus (a circuit 200) for read-disturb control in an embodiment according to the present invention. The circuit 200 can be embodied as part of or outside of the functional block that represents the memory unit 104 of FIG. 1.

The circuit 200 includes one or more word line drivers. In the example of FIG. 2, the circuit 200 includes 'n' word line drivers N_Wordline_En<0>, N_Wordline_En<1>, . . . , N_Wordline_En<n-1>. The word line drivers are coupled to word lines Wordline<0>, Wordline<1>, . . . , Wordline<n-1> in a bit cell array 205. Each of the word line drivers is connected to a corresponding word line in the bit cell array 205. For example, word line driver N_Wordline_En<n-1> is connected to Wordline<n-1>.

The bit cell array 205 may be implemented as an SRAM matrix of individual SRAM cells. Each SRAM cell in the bit cell array 205 can be made up of some number of transistors (e.g., six transistors) in a well known manner.

Each of the word line drivers includes a pull-up device PCH_WD. In one embodiment, the pull-up devices PCH_WD have different sizes. Using different sizes helps provide better control of the voltage levels on the word lines.

In one embodiment, each pull-up device is a PMOS device (e.g., a p-channel metal-oxide-semiconductor field-effect transistor). In one such embodiment, the sources nodes of the pull-up devices are connected to a shared node 210 (a charge-sharing node) via a single or shared line 212. That is, each of the 'n' word line drivers N_Wordline_En<0>, . . . , N_Wordline_En<n-1> is coupled to the charge-sharing node 210. The value of 'n' may be, for example, 32, 64, or 128.

The charging-sharing node 210 is coupled to a power supply 220. A precharge device 230 is coupled between the charge-sharing node 210 and the power supply 220 as shown in FIG. 2. In one embodiment, the precharge device 230 is a PMOS device.

In one embodiment, a keeper device 240 is also coupled between the charge-sharing node 210 and the power supply 220, parallel to the precharge device 230, as shown in FIG. 2. The keeper device is also coupled to ground. In one embodiment, the keeper device 240 is a PMOS device.

Thus, generally speaking, the circuit 200 includes a charge-sharing node that is connected to the pull-up devices in a group of 'n' word line drivers, and that is separated from a power supply by a header that includes a precharge device and that may also include a keeper device.

Operation of the circuit 200 may include two phases: a first (precharge) phase, and a second (evaluation) phase. During the precharge phase, the precharge device 230 charges the charge-sharing node 210 to a level corresponding to the voltage level Vdd of the power supply 220. Specifically, Q_share=Cdiff*Vdd, where Q_share is the charge at the charge sharing node and Cdiff is the parasitic capacitance of the charge-sharing node 210.

During the evaluation phase, a word line driver may be asserted and its associated pull-up device PCH_WD is turned on. The pull-up device of the asserted word line may short the charge-sharing node 210 and the word line interconnect of the associated word line, and allow the charge stored in the charge-sharing node to flow onto the parasitic capacitance of the interconnect. For example, word line driver N_Wordline_En<n-1> may be asserted and the pull-up device 248 may be asserted, shorting the charge-sharing node 210 and allowing the charge stored in the charge-sharing node 210 to flow from that node to Wordline<n-1> via the word line interconnect 250.

As the charge-sharing approaches its steady state, a voltage Vwl_rdc, below the supply level Vdd, may be reached at the asserted word line:

$$Vwl\_rdc<k> = Vdd * Cdiff/(Cdiff + Cwl<k>); \quad (1)$$

where Vwl_rdc<k> is the voltage level at the asserted word line 'k' (k=0, 1, . . . , n-1), Cdiff is the parasitic capacitance of the charge-sharing node 210, and Cwl<k> is the parasitic capacitance of the word line interconnect of the associated bit cell array.

Figure 3:
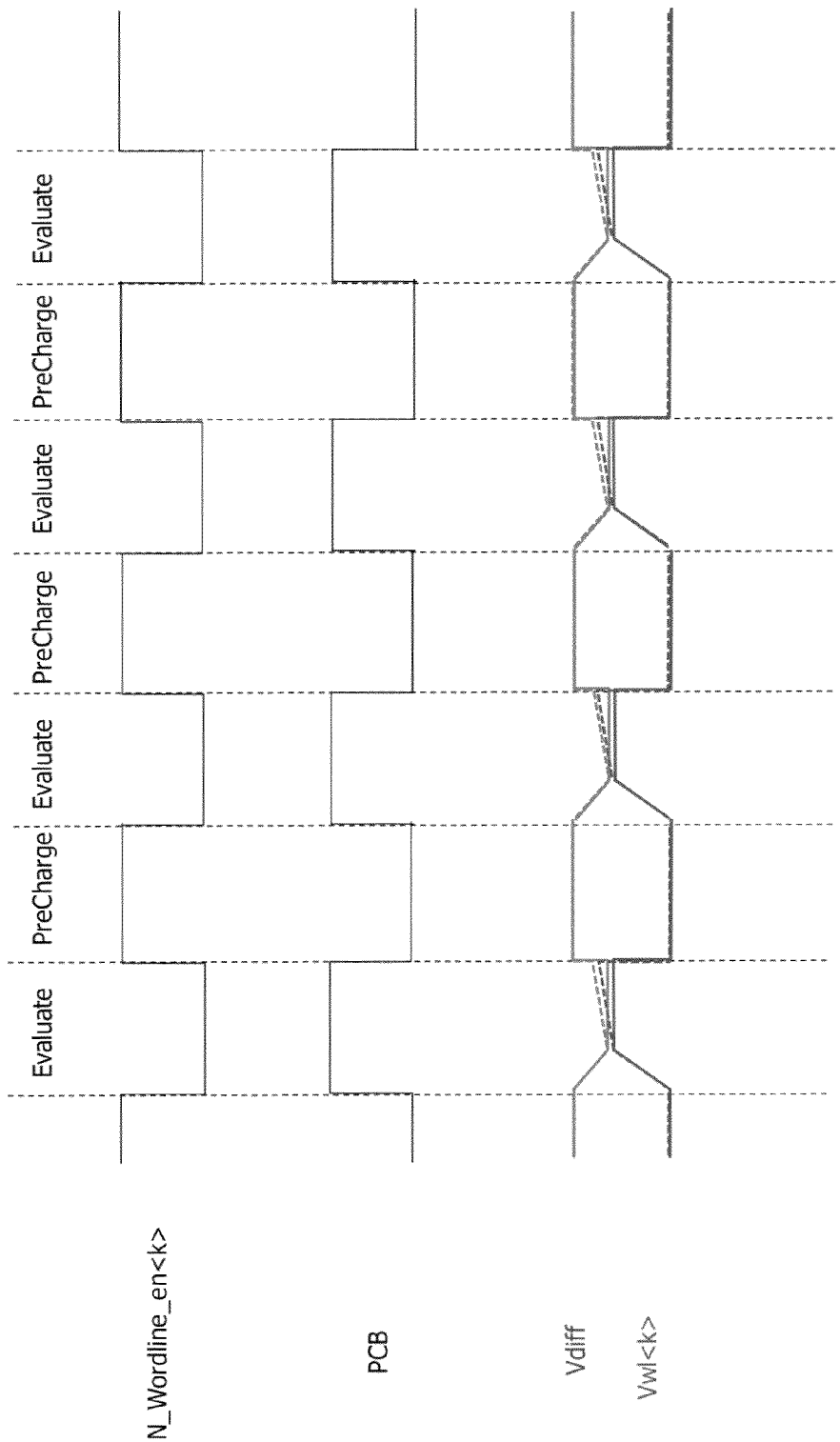
FIG. 3 illustrates a timing diagram and waveforms for a circuit in an embodiment according to the present invention.

FIG. 3 is a timing diagram for the circuit 200 of FIG. 2 in an embodiment according to the present invention. Referring to FIGS. 2 and 3, in the precharge phase, the precharge device 230 is asserted by the signal PCB under direction of the processing unit 102 (e.g., the memory interface circuit 108) of FIG. 1. Consequently, the charge sharing node 210 is charged to a level corresponding to Vdd (the voltage level of the power supply 220): Q_share=Cdiff*Vdd, where Q_share is the charge at the charge sharing node.

Continuing with reference to FIGS. 2 and 3, after the precharge phase, the evaluation phase may be entered. During the evaluation phase, the signal PCB is de-asserted and the precharge device 230 is turned off. The charge sharing node 210 is thus disconnected from the power supply 220. In the evaluation phase, one of the word line drivers N_Wordline_En<k> may be asserted under control of the memory interface circuit, and the pull-up device PCH_WD in the asserted word line driver is turned on. Thus, the charge sharing node 210 is now connected to its associated word line (Wordline<k>). The charge Q_share will flow from the charge sharing node 210 to the parasitic interconnect capacitance Cwl<k> until the voltage level Vwl_rdc is reached, where Vwl_rdc is given by equation (1) above.

FIG. 3 also illustrates waveforms for Vdiff and Vwl<k>, where Vdiff is the voltage associated with the parasitic capacitance Cdiff, and Vwl is the voltage level of the word line Wordline<k> corresponding to the selected (asserted) word line driver N_Wordline_En<k>. Vdiff and Vwl<k> may stay flat or rise steadily, depending on the strength of the keeper device 240 of FIG. 2. If the keeper device 240 is made weak, then it will simply compensate the leakage current of the device NCH_WD of the selected word line driver N_Wordline_En<k> and of other associated devices, and Vwl<k> will stay flat. If the keeper device 240 is made strong, then it will compensate the leakage current and also pull up Vwl<k> toward the end of the evaluation phase. In the latter case, the keeper device 240 holds the word line level steady and also generates a rising slope on the word line that has 1) a lower level in the beginning of the cycle to increase suppression on the read-disturb when the bit lines are near Vdd, and 2) a higher level toward the end of the cycle to relax the pass gates and to increase the read current of the bit cell when the bit lines drop away from Vdd and the read-disturb dwindles. Thus, the SRAM's bit cell can be provided with more read current toward the end of the evaluation phase, when the bit lines' voltage levels have dropped and the effects of read-disturb have diminished.

Figure 4:
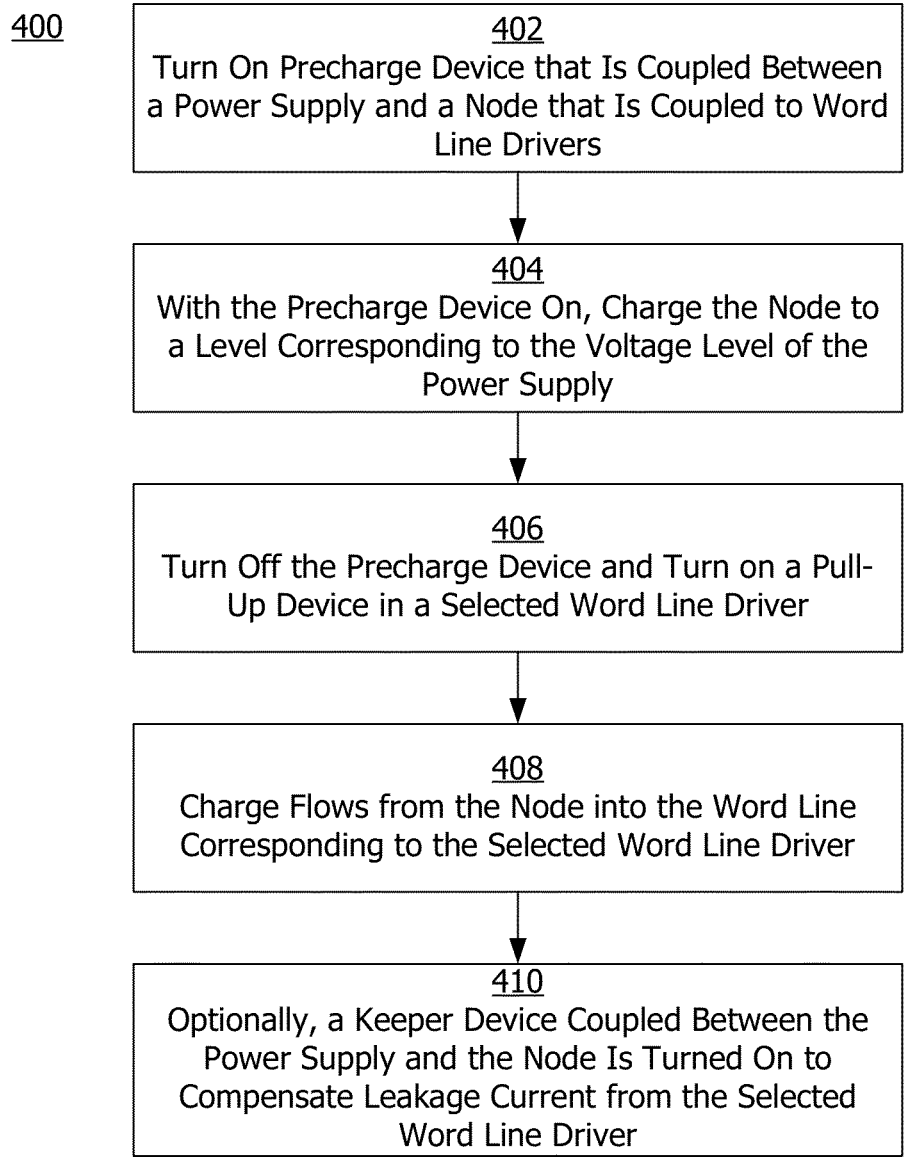
FIG. 4 is a flowchart illustrating examples of operations in a method of read-disturb control in an embodiment according to the present invention.

FIG. 4 is a flowchart 400 of an example of a method for read-disturb control in an embodiment according to the present invention. Although specific steps are disclosed in the flowchart 400, such steps are examples. That is, embodiments according to the present invention are well suited to performing various other steps or variations of the steps recited in the flowchart 400. Steps included in the flowchart 400 can be performed using the circuit 200 of FIG. 2, described above.

In block 402 of FIG. 4, with reference also to FIG. 2, a precharge device (230) that is coupled between a power supply (220) and a node (210) is turned on. The node is coupled to a plurality of word line drivers (N_Wordline_En<0>, N_Wordline_En<1>, . . . , N_Wordline_En<n−1>) via a shared line (212).

In block 404, with the precharge device turned on, the node is charged to the voltage level of the power supply via the precharge device.

In block 406, the precharge device is turned off and a pull-up device (e.g., 248) in a selected word line driver (N_Wordline_En<k>) is turned on.

In block 408, the charge stored in the node then flows into a word line (Wordline<k>) corresponding to the selected word line driver.

In block 410, in one embodiment, a keeper device (240) coupled between the power supply and the node is turned on to compensate leakage current from the selected word line driver.

In summary, embodiments according to the present invention control read-disturb while achieving a number of other benefits. For example, embodiments according to the present invention are able to utilize a relatively simple word line supply scheme based on a single rail instead of dual rails. Additional regulators, power supplies, and/or multiplexers are avoided, improving cost effectiveness and reducing design overhead. The circuit 200 (FIG. 2) is capacitance-based instead of resistance-based, thereby utilizing high currents and low resistances that are the most effective and robust for voltage modulation. Resistor elements are absent from the circuit 200, reducing area. Also, there is no voltage divider, meaning no direct current path and a large (e.g., an order of magnitude) reduction in leakage current. Furthermore, embodiments according to the present invention offer greater immunity to PVT variations. The deterministic charge-sharing effect of large diffusion capacitance reduces sensitivity to PVT variation. There is good tracking on NMOS vs. PMOS process corner skew—at the corner where NMOS is weaker and PMOS is stronger and read-disturb is low, the keeper device 240 can pull up the word line more rapidly to balance the read current and the read-disturb effect. Embodiments according to the present invention provide a relatively simple and therefore robust word line supply scheme that, by avoiding the shortcomings of conventional designs, is suitable for high-speed applications.

In the foregoing specification, embodiments of the invention have been described with reference to numerous specific details that may vary from implementation to implementation. Thus, the sole and exclusive indicator of what is, and is intended by the applicant to be, the invention is the set of claims that issues from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. An apparatus comprising:
   a plurality of pull-up devices coupled to a node via a shared line, wherein the plurality of pull-up devices comprise different sizes; and
   a precharge device coupled between a power supply and the node, wherein the precharge device and a pull-up device from the plurality of pull-up devices that is associated with a selected word line driver are configured for allowing the power supply to charge the node and allowing the charge stored in the node to flow into a word line corresponding to the selected word line driver, and the power supply is configured for providing an equivalent voltage to the precharge device and a keeper device coupled to the precharge device.

2. The apparatus of claim 1, wherein the node is charged to a voltage level of the equivalent voltage when the precharge device is turned on, and the charge stored in the node flows into the word line corresponding to the selected word line driver when the precharge device is turned off and the pull-up device is turned on.

3. The apparatus of claim 1, wherein the keeper device is further coupled to the power supply and the node, and wherein the keeper device is configured for offsetting leakage current associated with the selected word line driver when the keeper device is turned on.

4. The apparatus of claim 1, wherein the pull-up device, the precharge device, and the keeper device each comprise a P-type transistor.

5. The apparatus of claim 1, wherein a source node of the pull-up device is connected to the node.

6. The apparatus of claim 1, wherein a plurality of word line drivers comprise the plurality of pull-up devices.

7. The apparatus of claim 2, wherein the pull-up device, the precharge device, and the keeper device each comprise a P-type transistor.

8. A method comprising:
   turning on a precharge device that is coupled between a power supply and a node, wherein the node is coupled to a plurality of word line drivers via a shared line;
   providing an equivalent voltage to the precharge device and a keeper device coupled to the precharge device via the power supply;
   charging, with the precharge device turned on, the node to a voltage level corresponding to the equivalent voltage provided by the power supply; and
   turning off the precharge device and turning on a pull-up device associated with a selected word line driver from the plurality of word line drivers, wherein the charge stored in the node flows into a word line corresponding to the selected word line driver and a plurality of pull-up devices associated with the plurality of word line drivers comprise different sizes.

9. The method of claim 8, further comprising turning on the keeper device to compensate for leakage current generated by the selected word line driver.

10. The method of claim 8, wherein the pull-up device, the precharge device, and the keeper device each comprise a P-type transistor.

11. The method of claim 8, wherein a source node of the pull-up device is connected to the node.

12. The method of claim 8, wherein the plurality of word line drivers comprise 32 word line drivers, 64 word line drivers, or 128 word line drivers.

13. The method of claim 9, wherein the pull-up device, the precharge device, and the keeper device each comprise a P-type transistor.

14. An integrated circuit memory device, comprising:
an array of memory cells comprising a plurality of bit lines and a plurality of word lines;
a plurality of word line drivers coupled to the plurality of word lines, each of the word line drivers coupled to a node via a shared line, wherein the plurality of word line drivers comprise a plurality of pull-up devices that comprise different sizes;
a precharge device coupled between a power supply and the node, wherein the power supply is configured for providing an equivalent voltage to the precharge device and a keeper device coupled to the precharge device, the node is charged to a voltage level corresponding to the equivalent voltage provided by the power supply by turning on the precharge device, and the charge stored in the node flows into a word line corresponding to a selected word line driver from the plurality of word line drivers by turning off the precharge device and turning on a pull-up device associated with the selected word line driver.

15. The integrated circuit memory device of claim 14, wherein the keeper device is coupled between the power supply and the node, and the keeper device is configured for offsetting leakage current generated by the selected word line driver.

16. The integrated circuit memory device of claim 14, wherein the pull-up device, the precharge device, and the keeper device each comprise a P-type transistor.

17. The integrated circuit memory device of claim 14, wherein a source node of the pull-up device is connected to the node.

18. The integrated circuit memory device of claim 14, wherein the plurality of word line drivers comprise 32 word line drivers, 64 word line drivers, or 128 word line drivers.

19. The integrated circuit memory device of claim 15, wherein the pull-up device, the precharge device, and the keeper device each comprise a P-type transistor.

20. The integrated circuit memory device of claim 14, wherein the array of memory cells comprises static random access memory cells.

\* \* \* \* \*